(12) United States Patent
Zhou

(10) Patent No.: US 10,043,804 B2
(45) Date of Patent: Aug. 7, 2018

(54) LDMOS DESIGN FOR A FINFET DEVICE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/471,983

(22) Filed: Mar. 28, 2017

(65) Prior Publication Data

US 2017/0365602 A1 Dec. 21, 2017

(30) Foreign Application Priority Data

Jun. 15, 2016 (CN) .......................... 2016 1 0423223

(51) Int. Cl.
*H01L 21/336* (2006.01)
*H01L 27/092* (2006.01)
(Continued)

(52) U.S. Cl.
CPC .... *H01L 27/0922* (2013.01); *H01L 21/82385* (2013.01); *H01L 21/823814* (2013.01);
(Continued)

(58) Field of Classification Search
CPC ............. H01L 27/0922; H01L 29/0865; H01L 29/42376; H01L 29/4966; H01L 29/1095;
(Continued)

(56) References Cited

U.S. PATENT DOCUMENTS

2012/0175703 A1 7/2012 Park et al.
2014/0339649 A1* 11/2014 Campi, Jr. .......... H01L 29/7816
257/409

(Continued)

FOREIGN PATENT DOCUMENTS

EP 2755238 7/2014
EP 2953168 12/2015

OTHER PUBLICATIONS

European Application No. EP17174806.4, Extended European Search Report dated Oct. 27, 2017, 8 pages.

*Primary Examiner* — Charles Garber
*Assistant Examiner* — Abdulfattah Mustapha
(74) *Attorney, Agent, or Firm* — Kilpatrick Townsend & Stockton LLP

(57) ABSTRACT

A method of manufacturing a semiconductor device is provided. The device includes a substrate including a first type region and a second type region, first and second fins protruding from the substrate and separated by a trench. The first fin includes first and second portions of the first type on the first region and a third portion of the second type on the second region. A first gate structure surrounds the second portion and the third portion. A first work function adjusting layer is on the gate insulator layer on the first and second portions. A second work function adjusting layer is on the first work function adjusting layer, the gate insulator layer on the third portion, and the first insulator layer. The device also includes a gate on the second work function adjusting layer, (Continued)

a hardmask layer on the gate, and an interlayer dielectric layer surrounding the gate structure.

18 Claims, 8 Drawing Sheets

(51) Int. Cl.
H01L 21/8238 (2006.01)
H01L 29/78 (2006.01)
H01L 29/66 (2006.01)
H01L 29/10 (2006.01)
H01L 29/49 (2006.01)
H01L 29/423 (2006.01)
H01L 29/08 (2006.01)

(52) U.S. Cl.
CPC .. *H01L 21/823821* (2013.01); *H01L 27/0924* (2013.01); *H01L 29/0865* (2013.01); *H01L 29/0882* (2013.01); *H01L 29/1095* (2013.01); *H01L 29/42376* (2013.01); *H01L 29/4966* (2013.01); *H01L 29/66681* (2013.01); *H01L 29/7816* (2013.01); *H01L 29/7851* (2013.01)

(58) Field of Classification Search
CPC ......... H01L 21/823814; H01L 29/0882; H01L 29/66681; H01L 27/0924; H01L 29/7851; H01L 29/7816; H01L 21/823821; H01L 21/82385

See application file for complete search history.

(56) References Cited

U.S. PATENT DOCUMENTS

2015/0076610 A1* 3/2015 Ito .................... H01L 29/785
257/365
2016/0149030 A1 5/2016 Kim et al.
2016/0293602 A1* 10/2016 Liu .................... H01L 27/098

* cited by examiner

_LDMOS DESIGN FOR A FINFET DEVICE_

CROSS-REFERENCES TO RELATED APPLICATIONS

The present application claims priority to Chinese patent application No. 201610423223.8, filed with the State Intellectual Property Office of People's Republic of China on Jun. 15, 2016, the content of which is incorporated herein by reference in its entirety.

FIELD OF THE INVENTION

The present invention relates to integrated semiconductor devices, and more particularly to methods for manufacturing a fin-type field effect transistor device.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have good control capability of gates to effectively suppress the short channel effect. FinFET devices can also reduce random dopant fluctuation to improve the stability of the devices. Thus, FinFET devices are widely used in the design of small-sized semiconductor elements.

Laterally Diffused Metal Oxide Semiconductor (LDMOS) devices are one of the important components for developing cost-effective system-on-a-chip applications.

In a conventional LDMOS device, a portion of a gate oxide and a portion of a gate electrode cover a shallow trench isolation (STI) region, where the gate oxide may be easily punctured, thereby limiting the source and drain breakdown performance of the LDMOS device.

Therefore, there is a need for improved methods for manufacturing a fin-type semiconductor device to overcome the these drawbacks.

BRIEF SUMMARY OF THE INVENTION

Embodiments of the present invention provide a method for manufacturing a semiconductor device. The method may include providing a semiconductor structure that includes a semiconductor substrate having a first region of a first conductivity type and a second region of a second conductivity type, the first and second regions being laterally adjacent to each other, the first conductivity type being different from the second conductivity type, a first fin and a second fin protruding from the semiconductor substrate and separated from each other by a trench. The first fin includes first and second portions of the first conductivity type and disposed on the first region, and a third portion of the second conductivity type disposed on the second region, the first portion has an upper surface lower than an upper surface of the second portion, the second and third portions are laterally adjacent to each other; the second fin is of the second conductivity type and disposed on the second region, and a first insulator layer filling at least a portion of the trench. The method may further include forming a first gate structure surrounding a portion of the second portion and a portion of the third portion. The first gate structure includes a first distal end on the first portion and a second distal end on the first insulator layer, a gate insulator layer on a surface portion of the first portion, the second portion, and the third portion; a first gate on the gate insulator layer, and a hardmask layer surrounding the first gate. The method may also include forming an interlayer dielectric layer on the first gate structure, planarizing the interlayer dielectric layer and the hardmask layer to expose the first gate, removing the first gate to expose the gate insulator layer and a surface portion of the first insulator layer, forming a first work function adjusting layer on a portion of the gate insulator layer on the surface portion of the first portion and on the second portion, and forming a second work function adjusting layer on the first work function adjusting layer, the gate insulator layer on the third portion, and the exposed surface portion of the first insulator layer.

In one embodiment, the first conductivity type is N-type, the second conductivity type is P-type, the first work function adjusting layer is a PMOS work function adjusting layer, and the second work function adjusting layer is an NMOS work function adjusting layer.

In one embodiment, the first work function adjusting layer comprises titanium nitride or tantalum nitride, and the second work function adjusting layer comprises a titanium aluminum alloy.

In one embodiment, the first conductivity type is P-type, the second conductivity type is N-type, the first work function adjusting layer is an NMOS work function adjusting layer, and the second work function adjusting layer is a PMOS work function adjusting layer.

In one embodiment, the first work function adjusting layer comprises a titanium aluminum alloy, and the second work function adjusting layer comprises titanium nitride or tantalum nitride.

In one embodiment, the first gate structure covers a first portion of the first portion, the method further includes, prior to forming the interlayer dielectric layer on the first gate structure, forming a source on a second portion of the first portion that is not covered by the first gate structure and a drain on the second fin, wherein the source and the drain are covered by the subsequent formed interlayer dielectric layer.

In one embodiment, the method may further include forming a second gate on the second work function adjusting layer.

In one embodiment, forming the first work function adjusting layer includes forming a patterned mask layer covering a first portion of the first work function adjusting layer on the gate insulator layer that is on the first and second portions while exposing a second portion of the first work function adjusting layer that is on the gate insulator layer on the third portion and the exposed surface portion of the insulator layer, removing the second portion of the first work function adjusting layer, and removing the patterned mask layer.

In one embodiment, the upper surface of the second portion is flush with the upper surface of the third portion.

In one embodiment, the first work function adjusting layer is further formed on an inner wall of the hardmask layer on the first portion.

Embodiments of the present invention also provides a semiconductor device. The semiconductor device may include a semiconductor substrate having a first region of a first conductivity type and a second region of a second conductivity type, the first and second regions are laterally adjacent to each other, the first conductivity type is different from the second conductivity type, a first fin and a second fin protruding from the semiconductor substrate and separated from each other by a trench, the first fin includes first and second portions of the first conductivity type and disposed on the first region and a third portion of the second conductivity type disposed on the second region, the first portion has an upper surface lower than an upper surface of the second portion, the second and third portions are laterally adjacent to each other, the second fin is of the second conductivity type and disposed on the second region, and a first insulator layer filling at least a portion of the trench. The semiconductor device also includes a first gate structure surrounding a portion of the second portion and a portion of the third portion. The first gate structure includes a first distal end on the first portion and a second distal end on the first insulator layer, a gate insulator layer on a surface portion of the first portion, the second portion, and the third portion, a first work function adjusting layer on a portion of the gate insulator layer that is on the surface portion of the first portion and the second portion, a second work function adjusting layer on the first work function adjusting layer, a portion of the gate insulator layer on the third portion, and a surface portion of the first insulator layer, a gate on the second work function adjusting layer, and a hardmask layer having first and second portions on opposite sides of the gate, the first portion of the hardmask layer disposed on the first portion and the second portion of the hardmask layer disposed on the first insulator layer. The semiconductor also includes an interlayer dielectric layer surrounding the gate structure.

In one embodiment, the semiconductor device further includes a source on the first portion and a drain on the second fin. The first portion of the hardmask layer is disposed between the source and the gate, and the interlayer dielectric layer covers the source and the drain.

In one embodiment, the upper surface of the second portion is flush with the upper surface of the third portion.

In one embodiment, the first work function adjusting layer is on the first portion of the hardmask layer, and the second work function adjusting layer is on the second portion of the hardmask layer.

The following detailed description together with the accompanying drawings will provide a better understanding of the nature and advantages of the present invention.

DETAILED DESCRIPTION OF THE INVENTION

Figure 1:
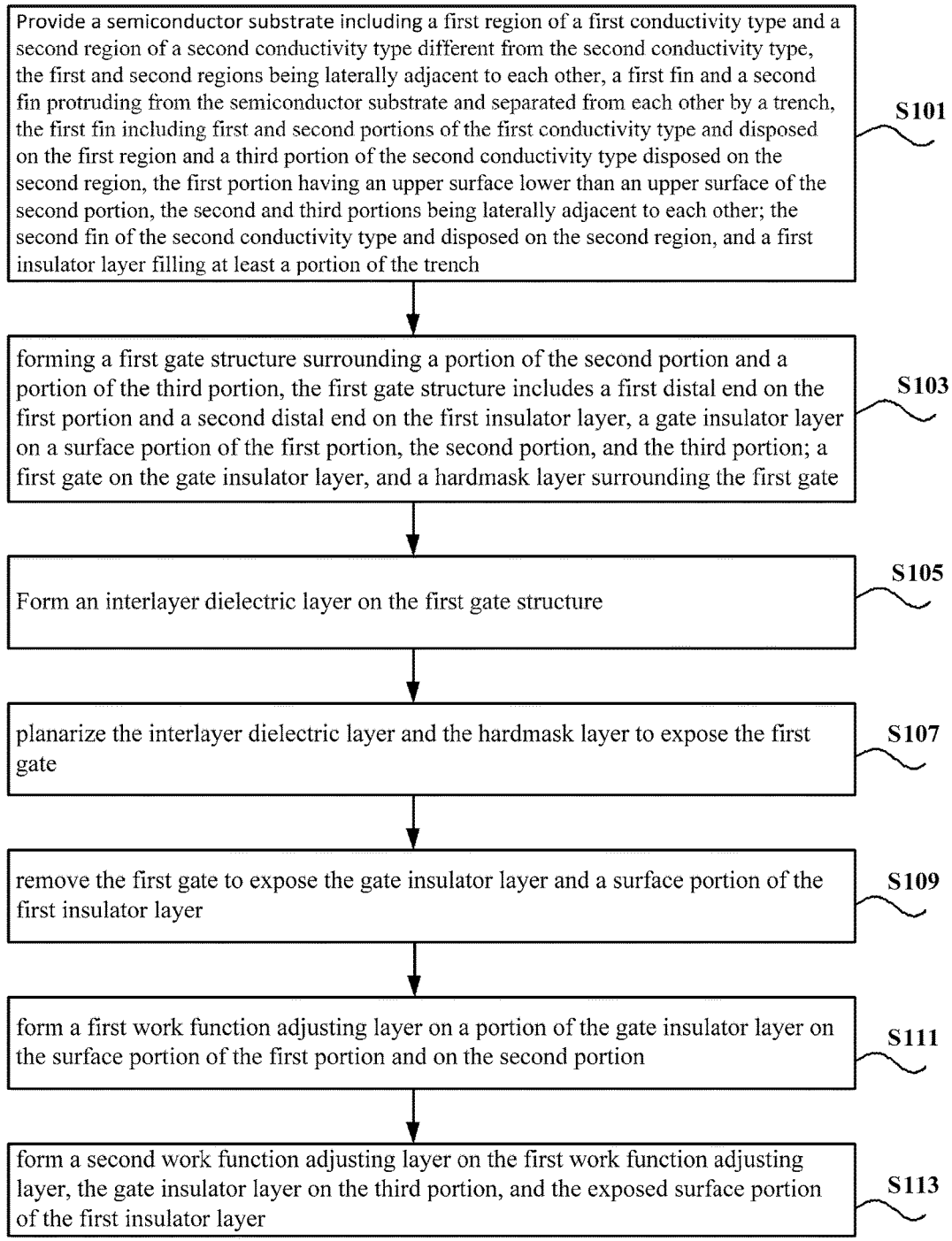
FIG. 1 is a flowchart of a method for manufacturing a semiconductor device according to some embodiments of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a flowchart of a method for manufacturing a semiconductor device according to some embodiments of the present invention. FIGS. 2 through 14 are cross-sectional views illustrating intermediate stages of a semiconductor device manufactured with a method according to some embodiments of the present invention.

Referring to FIG. 1, the method may include the following process steps:

At S101: providing a semiconductor structure.

Figure 2:
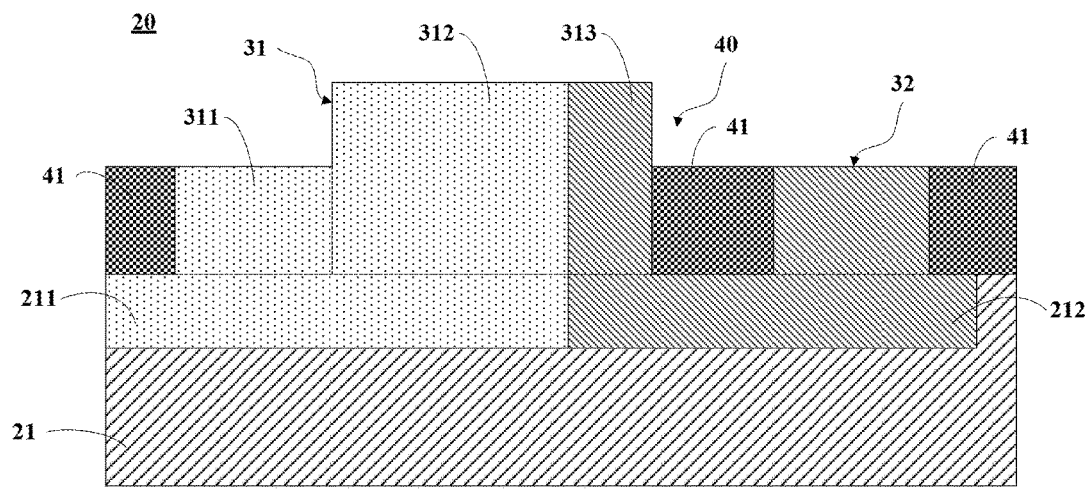
FIG. 2 is a cross-sectional view illustrating an intermediate stage of a semiconductor device manufactured with a method according to some embodiments of the present invention.

FIG. 2 is a cross-sectional view illustrating an intermediate stage of a semiconductor device according to S101. As shown in FIG. 2, a semiconductor structure 20 is provided. Semiconductor structure 20 may include a semiconductor substrate (e.g., a silicon substrate) 21. Semiconductor substrate 21 may include a first region 211 having a first conductivity type and a second region 212 having a second conductivity type. First region 211 is laterally adjacent to second region 212. The first conductivity type is different from the second conductivity type. For example, the first conductivity type is an N-type, and the second conductivity type is a P-type. Conversely, the first conductivity type is the P-type, and the second conductivity type is the N-type.

In some embodiments, referring to FIG. 2, semiconductor structure 20 may also include a first fin 31 and a second fin 32 protruding from semiconductor substrate 21 and separated from each other by a trench 40. First fin 31 may include a first portion 311 and a second portion 312 each having the first type conductivity type and disposed on first region 211 and a third portion 313 having the second conductivity type and disposed on second region 212. First portion 311 has an upper surface that is lower than the upper surface of second portion 312. Second portion 312 and third portion 313 are laterally adjacent to each other. In an embodiment, the upper surface of second portion 312 is flush with the upper surface of third portion 313. Second fin 32 has the second conductivity type and is disposed on second region 212.

It is noted that the first portion of the first fin is recessed relative to the second and third portions of the first fin using an etching process. For example, the second fin is also recessed relative to the second and third portions of the first fin using an etching process. It is to be understood, however, that the recess treatment herein is mainly used for subsequent epitaxial growth on the remaining portion after the recess. The present invention is not limited thereto. For example, the second fin may not be subjected to a recess treatment.

It is noted that, as used herein, unless specifically stated otherwise, the terms "substantially coplanar" and "substantially flush" refer to surfaces that are sufficiently coplanar or flush within the process variation tolerance.

In some embodiments, referring to FIG. 2, semiconductor structure 20 may also include a first insulator layer 41 that at least partially fills (e.g., partially or completely fills) trench 40. In some embodiments, first insulator layer 41 may fill a trench around first fin 31 and second fin 32 as well, as shown in FIG. 2. In an exemplary embodiment, the first insulator layer may include silicon dioxide.

In some embodiments, forming semiconductor structure 20 may include providing a substrate, e.g., a silicon substrate. In an embodiment, the method may include performing a first dopant implantation onto the first region and performing a second dopant implantation onto the second region of the semiconductor structure that is laterally adjacent to the first region. The first dopant implantation includes a first dopant of the first conductivity type that is different from a second dopant of the second ion implantation having the second conductivity type. In an embodiment, the method may further include performing an etch process into the first doped region and the second doped region to form a first fin and a second fin that are separated from each other by a trench. The first fin may include first and second portions having the first conductivity type and a third portion having a second conductivity type. The upper surface of the first portion is lower than the upper surface of the second portion. The second portion is laterally adjacent to the first portion. The second fin has the second conductivity type. In an embodiment, the method may further include depositing a first insulator layer and etching the first insulator layer to at least partially filling the trench.

Referring back to FIG. 1, at S103, the method may further include forming a first gate structure surrounding a portion of the second portion and a portion of the third portion, the first gate structure has a first distal end disposed on the first portion and a second distal end disposed on the first insulator layer. The first gate structure includes a gate insulator layer on a portion of the upper surface of the first, second and third portions, a first gate on the gate insulator layer, and a hardmask layer on the first gate.

Figure 3:
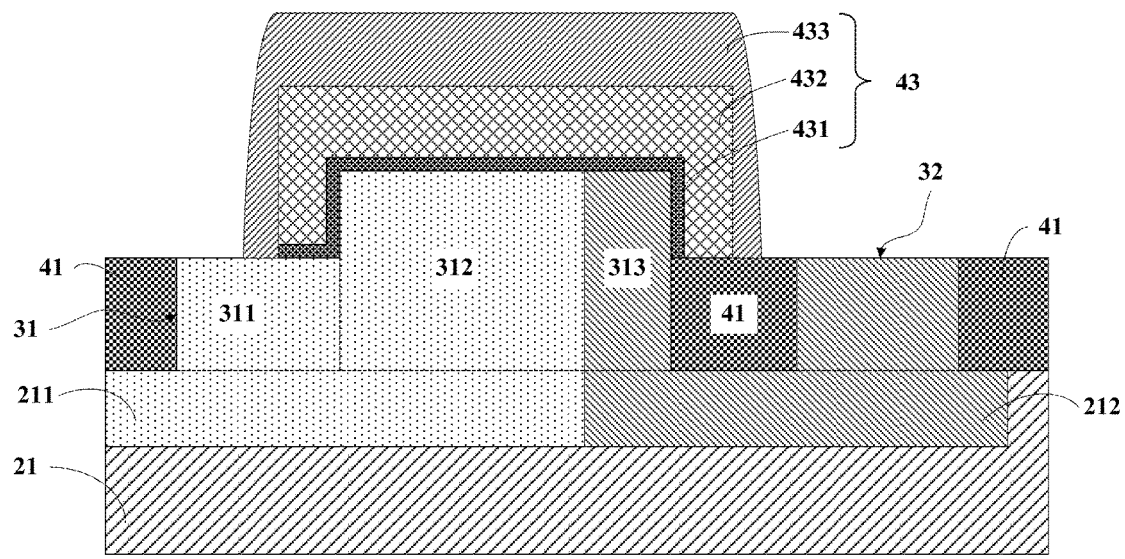
FIG. 3 is a cross-sectional view illustrating an intermediate stage of a semiconductor device manufactured with a method according to some embodiments of the present invention.

FIG. 3 is a cross-sectional view illustrating an intermediate stage of a semiconductor device according to S103. As shown in FIG. 3, a first gate structure 43 is formed surrounding a portion of second portion 312 and a portion of third portion 313. First gate structure 43 has a first distal end on first portion 311 and a second distal end on first insulator layer 41. In an exemplary embodiment, first gate structure 43 may include a gate insulator layer 431 on a surface portion of first portion 311, second portion 312 and third portion 313, a first gate 432 on gate insulator layer 431, and a hardmask layer 433 surrounding first gate 432.

In some embodiments, a gate insulator layer may be formed on a portion of the surface of first portion 311, second portion 312, and third portion 313 using a deposition process. A first gate material layer may be formed on the gate insulator layer 431. In an embodiment, the gate insulator layer and the first gate material layer may be etched to form gate insulator layer 431 and first gate 432, as shown in FIG. 3. In an exemplary embodiment, the gate insulator layer may include silicon dioxide, and the first gate may include polysilicon.

In some embodiments, a hardmask layer may be deposited on first gate 432 of the semiconductor structure. In an embodiment, the hardmask layer is etched to form hardmask layer 433, as shown in FIG. 3. The hardmask layer may include silicon nitride.

It is noted that gate insulator layer 431 is formed on sidewalls of third portion 313, but in other embodiments, gate insulator layer 431 may extend to the surface of first insulator layer 41. The scope of the present invention is not limited to the morphology of the gate insulator layer shown in FIG. 3.

Referring back to FIG. 1, at S105, the method may further include, after forming the first gate structure, forming an interlayer dielectric layer on the semiconductor structure.

Figure 5:
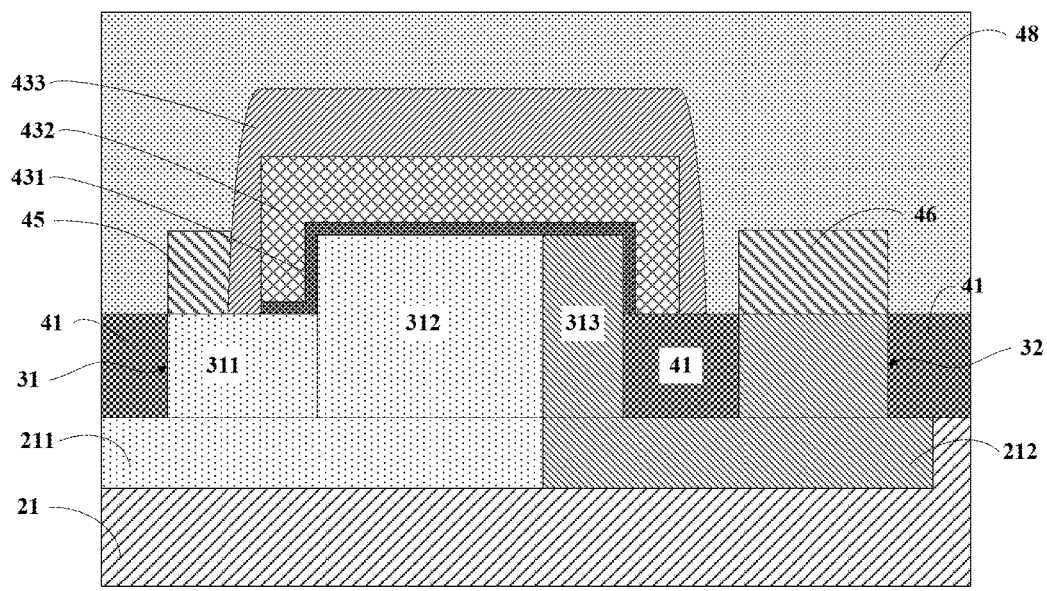
FIG. 5 is a cross-sectional view illustrating an intermediate stage of a semiconductor device manufactured with a method according to some embodiments of the present invention.

FIG. 5 is a cross-sectional view illustrating an intermediate stage of a semiconductor device according to S105. As shown in FIG. 5, an interlayer dielectric layer is formed on the semiconductor structure using a deposition process, after forming the first gate structure. In an embodiment, the interlayer dielectric layer includes silicon dioxide.

Figure 4:
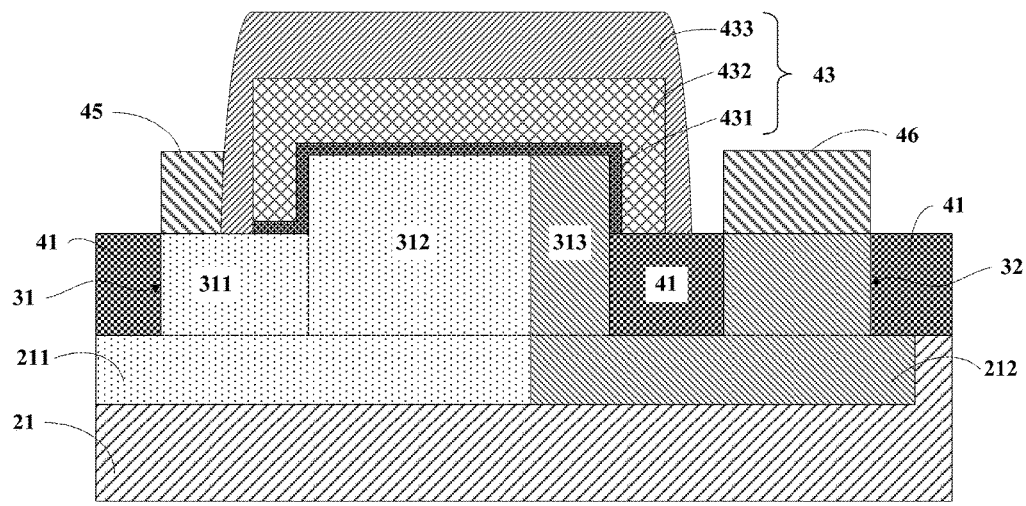
FIG. 4 is a cross-sectional view illustrating an intermediate stage of a semiconductor device manufactured with a method according to some embodiments of the present invention.

In some embodiments, first gate structure 43 covers a portion of first portion 311, as shown in FIG. 4. In an embodiment, before forming interlayer dielectric layer 48, the method may also include forming a source 45 on a surface portion of first portion 311 that has not been covered by first gate structure 43 and a drain 46 on second fin 32. In an embodiment, the source and drain may include silicon germanium (SiGe). In some embodiments, the source and drain may be formed using an epitaxial growth process. In an embodiment, the source and drain may be doped with boron. In some embodiments, the first and second fins may be doped to form a source and a drain. In an embodiment, interlayer dielectric layer 48 may cover source 45 and drain 46, as shown in FIG. 5.

Referring back to FIG. 1, at S107, the method may further include performing a planarization process on the interlayer dielectric layer and the hardmask layer to expose a surface of the first gate.

Figure 6:
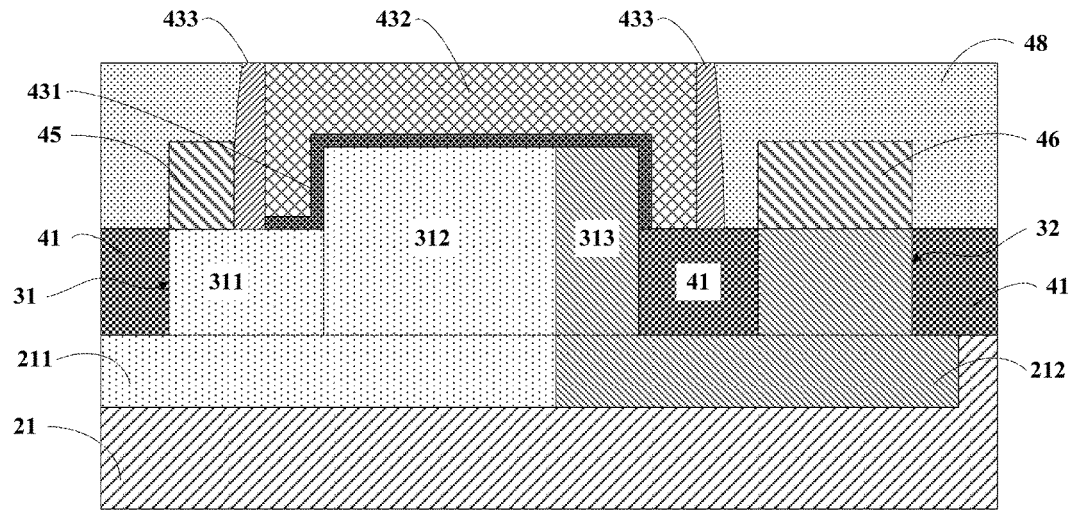
FIG. 6 is a cross-sectional view illustrating an intermediate stage of a semiconductor device manufactured with a method according to some embodiments of the present invention.

FIG. 6 is a cross-sectional view illustrating an intermediate stage of a semiconductor device according to S107. As shown in FIG. 6, a planarization (e.g., chemical mechanical polishing) process is performed on interlayer dielectric layer 48 and hardmask layer 433 to expose a surface of first gate 432.

Referring back to FIG. 1, at S109, the method may further include removing the first gate to expose the gate insulator layer and a portion of the first insulator layer.

Figure 7:
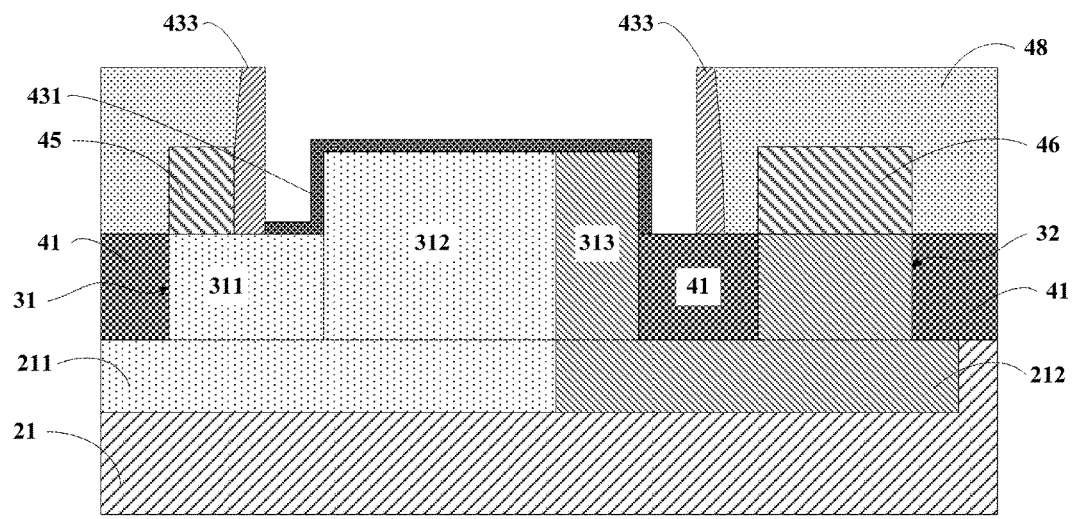
FIG. 7 is a cross-sectional view illustrating an intermediate stage of a semiconductor device manufactured with a method according to some embodiments of the present invention.

FIG. 7 is a cross-sectional view illustrating an intermediate stage of a semiconductor device according to S109. As shown in FIG. 7, first gate 432 is removed to expose gate insulator layer 431 and a portion of first insulator layer 41.

In some embodiments, gate insulator layer 431 may extend to the surface of first insulator layer 41, so that first gate 432 is removed to exposed the portion of gate insulator layer 431 on first insulator layer 41 at S109.

Referring back to FIG. 1, at S111, the method may further include forming a first work function adjusting layer on the surface portion of the gate insulator layer disposed on the first portion and second portion.

Figure 8:
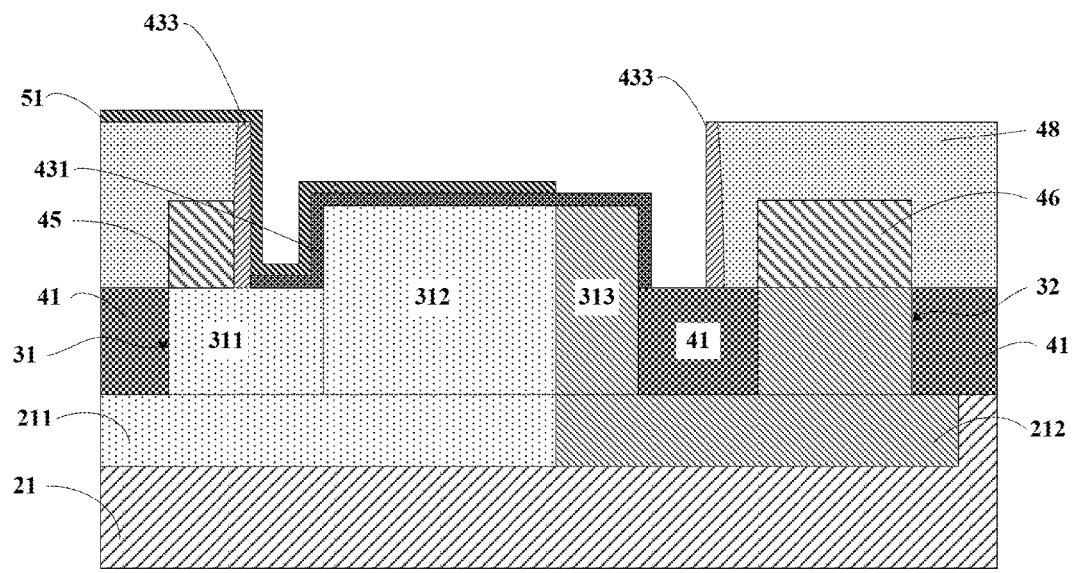
FIG. 8 is a cross-sectional view illustrating an intermediate stage of a semiconductor device manufactured with a method according to some embodiments of the present invention.

FIG. 8 is a cross-sectional view illustrating an intermediate stage of a semiconductor device according to S111. As shown in FIG. 8, a first work function adjusting layer 51 is formed on the surface of the portion of gate insulator layer 431 disposed on first portion 311 and second portion 312. In some embodiments, first work function adjusting layer 51 may also be formed on a sidewall of hardmask layer 433 on first portion 311, as shown in FIG. 8.

It is noted that a portion of first work function adjusting layer 51 may also be formed on a portion of interlayer dielectric layer 48, but first work function adjusting layer 51 can be removed in subsequent processes.

In some embodiments, the first conductivity type is N-type, and the second conductivity type is P-type. The first work function adjusting layer is a PMOS work function adjusting layer. The first work function adjusting layer may include titanium nitride (TiN) or tantalum nitride (TaN).

In some embodiments, the first conductivity type is P-type, and the second conductivity type is N-type. The first work function adjusting layer is an NMOS work function adjusting layer. The first work function adjusting layer may include titanium aluminum alloy (TiAl).

The process of forming the first work function adjusting layer will be described below with reference to FIG. 8 and FIGS. 10-12.

Figure 10:
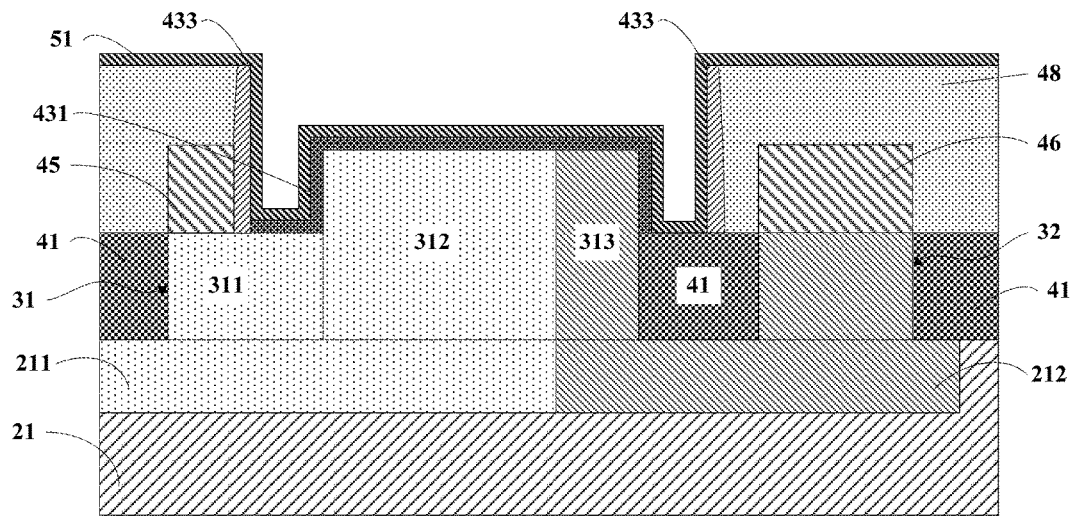
FIG. 10 is a cross-sectional view illustrating an intermediate stage of a semiconductor device manufactured with a method according to some embodiments of the present invention.

In some embodiments, the method of forming the first work function adjusting layer may include forming a first work function adjusting layer 51 on the semiconductor substrate after the first gate has been removed, as shown in FIG. 10. The first work function adjusting layer may be formed using a deposition process. In some embodiments, the first work function adjusting layer may be formed on interlayer dielectric layer 48, sidewalls of hardmask layer 433, gate insulator layer 431 and the exposed portion of first insulator layer 41, as shown in FIG. 10.

Figure 11:
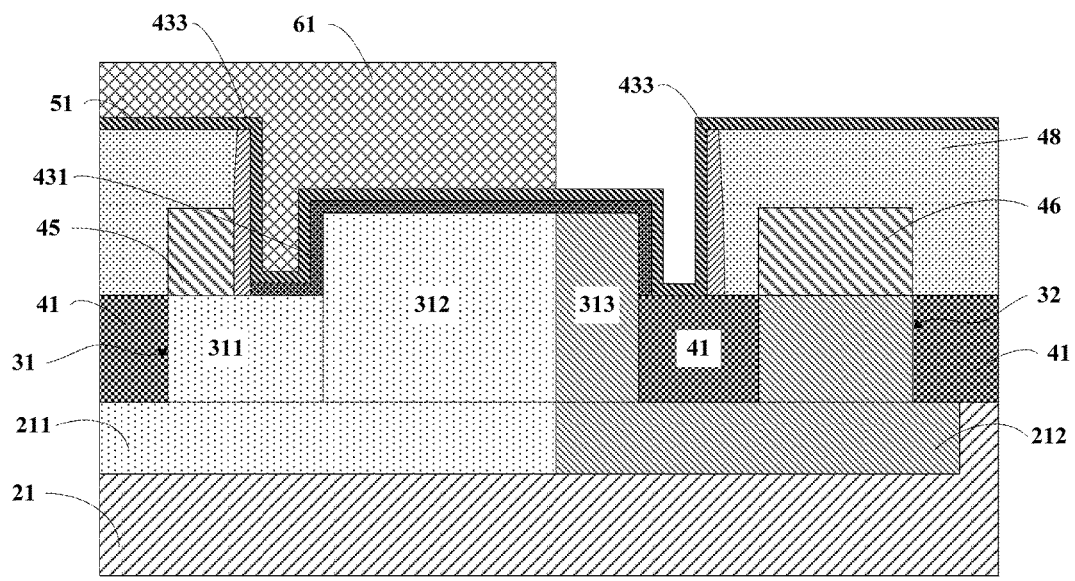
FIG. 11 is a cross-sectional view illustrating an intermediate stage of a semiconductor device manufactured with a method according to some embodiments of the present invention.

In an exemplary embodiment, the method of forming the first work function adjusting layer may further include forming a patterned mask layer (e.g., photoresist) 61 using a coating process covering a portion of the first work function adjusting layer on a portion of gate insulator layer 431 which is disposed on first portion 311 and on second portion 312 while exposing a portion of the first work function adjusting layer on a portion of gate insulating layer 431 on third portion 313, on a portion of first insulator layer 41 and on a portion of interlayer dielectric layer 48 on second fin 32, as shown in FIG. 11.

Figure 12:
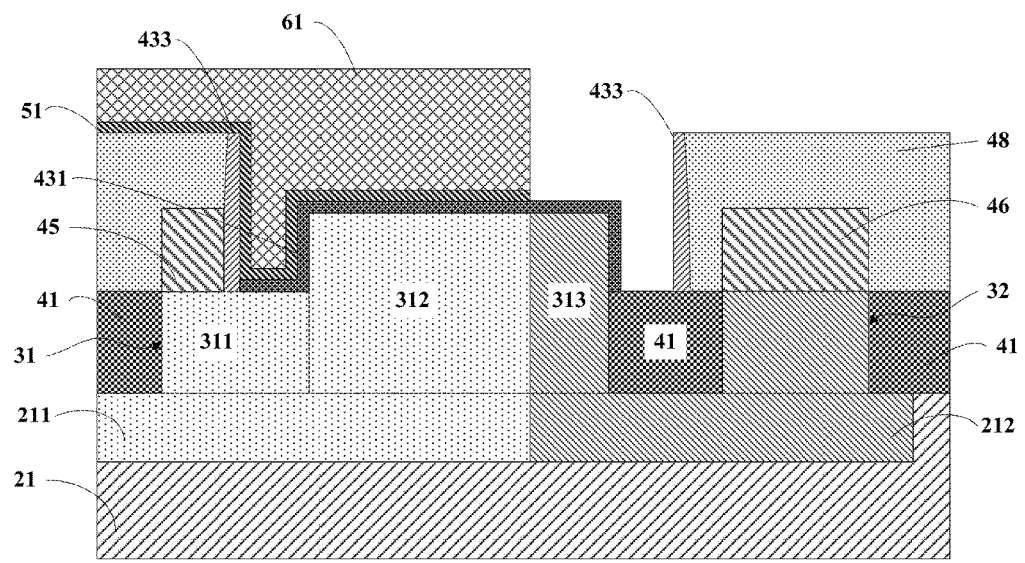
FIG. 12 is a cross-sectional view illustrating an intermediate stage of a semiconductor device manufactured with a method according to some embodiments of the present invention.

In an exemplary embodiment, the method of forming the first work function adjusting layer may further include removing a portion of the first work function adjusting layer that is not covered by patterned mask layer 61, as shown in FIG. 12.

In an exemplary embodiment, the method of forming the first work function adjusting layer may further include removing patterned mask layer 61. Thus, first work function adjusting layer 51 is obtained, as shown in FIG. 8.

Referring back to FIG. 1, at S113, the method may further include forming a second work function adjusting layer on the first work function adjusting layer, on the portion of gate insulator layer on the third portion and on a portion of the first insulator layer.

Figure 9:
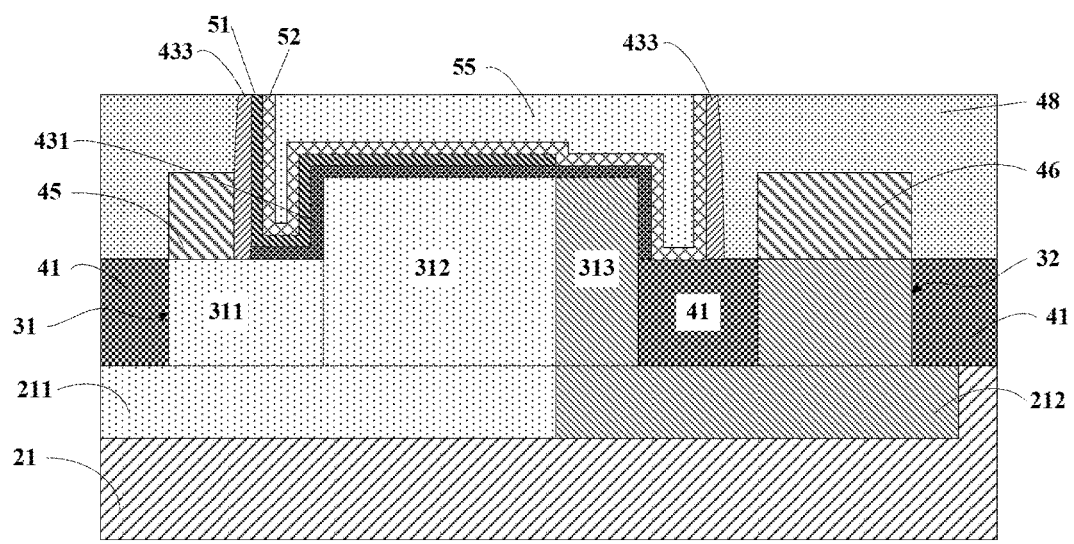
FIG. 9 is a cross-sectional view illustrating an intermediate stage of a semiconductor device manufactured with a method according to some embodiments of the present invention.

FIG. 9 is a cross-sectional view illustrating an intermediate stage of a semiconductor device according to S113. As shown in FIG. 9, a second work function adjusting layer 52 is formed on first work function adjusting layer 51, on a portion of gate insulator layer 431 disposed on third portion 313, and on a portion of first insulator layer 41. In some embodiments, second work function adjusting layer 52 may also formed on a portion of hardmask layer 433, as shown in FIG. 9.

In some embodiments, the first conductivity type is N-type, and the second conductivity type is P-type. The second work function adjusting layer is an NMOS work function adjusting layer. The second work function adjusting layer may include titanium aluminum alloy (TiAl).

In some embodiments, the first conductivity type is P-type, and the second conductivity type is N-type. The second work function adjusting layer is a PMOS work function adjusting layer. The second work function adjusting layer may include titanium nitrite (TiN) or tantalum nitride (TaN).

Figure 13:
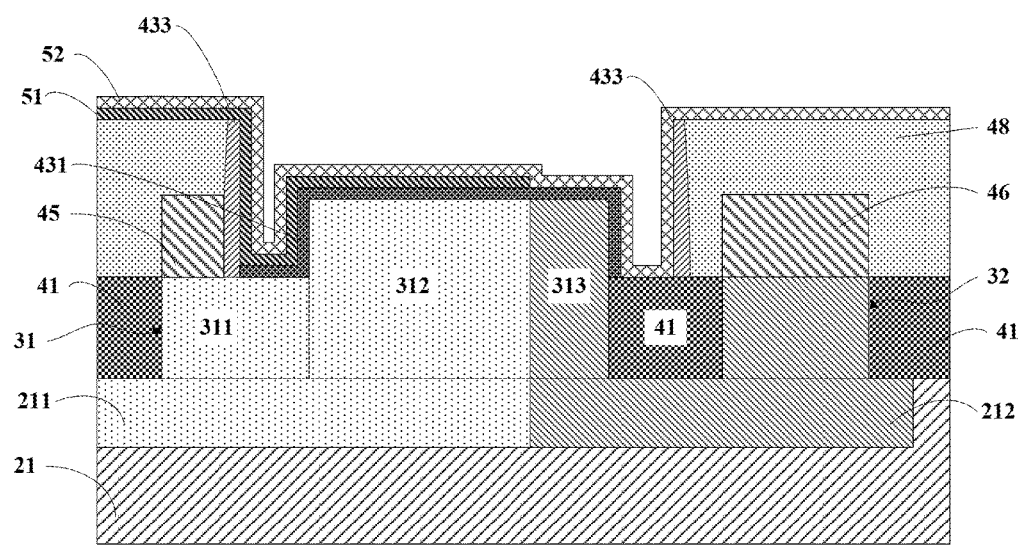
FIG. 13 is a cross-sectional view illustrating an intermediate stage of a semiconductor device manufactured with a method according to some embodiments of the present invention.

In some embodiments, as shown in FIG. 13, second work function adjusting layer 52 may be deposited on the semiconductor structure after the formation of first work function adjusting layer 51 (e.g., the semiconductor structure of FIG. 8). In an embodiment, a portion of second work function adjusting layer 52 and first work function adjusting layer 51 on interlayer dielectric layer 48 may be removed.

Thus, a method of manufacturing a semiconductor device according to some embodiments of the present invention is provided.

In some embodiments, the method may further include forming a second gate 55 on second work function adjusting layer 52, as shown in FIG. 9.

Figure 14:
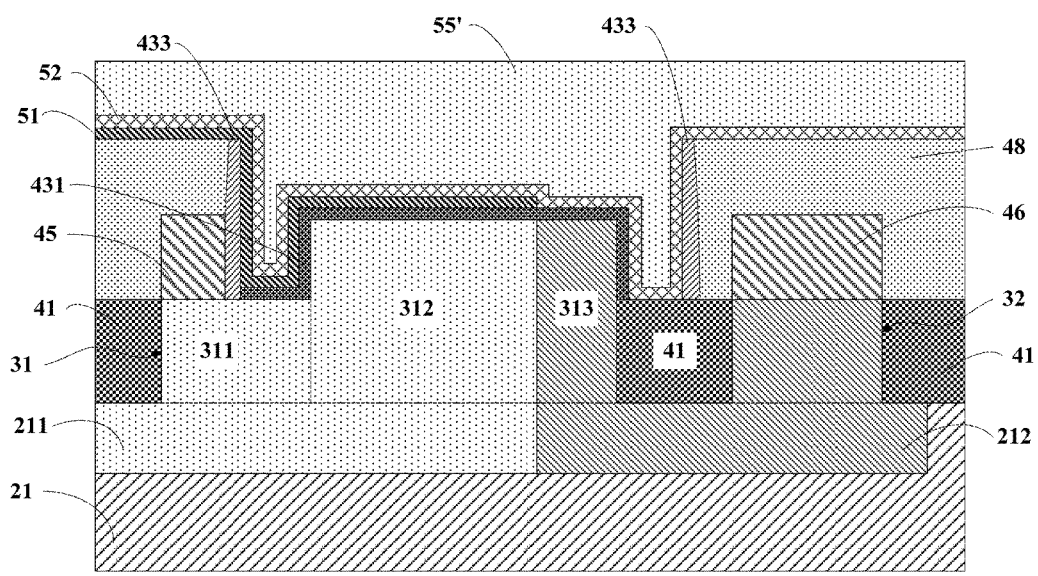
FIG. 14 is a cross-sectional view illustrating an intermediate stage of a semiconductor device manufactured with a method according to some embodiments of the present invention.

In some embodiments, the method may include forming a conductive material layer 55' using a deposition process on second work function adjusting layer 52, as shown in FIG. 14. Conductive material layer 55' may include a metal, such as tungsten, aluminum, or the like.

In some embodiments, the process of forming the second gate may include planarizing (e.g., chemical mechanical polishing) the conductive material layer 55' until a surface of interlayer dielectric layer 48 is exposed, as shown in FIG. 9. In an embodiment, the planarization may also remove the portion of second work function adjusting layer 52 and first work function adjusting layer 51 on interlayer dielectric layer 48.

Embodiments of the present invention also provide a semiconductor device. Referring to FIG. 9, the semiconductor device may include a semiconductor substrate (e.g., silicon substrate) 21. Semiconductor substrate 21 may include a first region 211 having a first conductivity type and a second region 212 having a second conductivity type. First region 211 and second region 212 are laterally adjacent to each other. The first conductivity type is different from the second conductivity type. For example, the first conductivity type is N-type, and the second conductivity type is P-type. Conversely, the first conductivity type is P-type, and the second conductivity type is N-type.

In an embodiment, referring to FIG. 9, the semiconductor device may also include a first fin 31 and a second fin 32 protruding from semiconductor substrate 21 and separated from each other by a trench (trench 40 in FIG. 2). First fin 31 may include a first portion 311 and a second portion 312 each having a first conductivity type, and a third portion 313 disposed on second region 212 and having a second conductivity type. First portion 311 has an upper surface that is lower than the upper surface of second portion. Second portion 312 and third portion are laterally adjacent to each other. In an embodiment, the upper surface of second portion 312 is flush with the upper surface of third portion 313. Second fin 32 has the second conductivity type and is disposed on second region 212.

In an embodiment, referring to FIG. 9, the semiconductor device may also include a first insulator layer 41 filling at least (e.g., filling partially or completely) the trench. In some embodiments, the first insulator layer may also fill a trench surrounding first fin 31 and second fin 32, as shown in FIG. 9. The first insulator layer may include silicon dioxide.

In an embodiment, referring to FIG. 9, the semiconductor device may also include a gate structure surrounding the second and third portions. The gate structure has a first distal end disposed on first portion 311 and a second distal end disposed on first insulator layer 41. The gate structure may include a gate insulator layer 431 on a portion of a surface of first, second, and third portions 311, 312, and 313. The gate insulator layer may include silicon dioxide. The gate structure may also include a first work function adjusting layer 51 that is on a portion of gate insulator layer 431 disposed on first portion 311 and on a portion of second portion 312. The gate structure may further include a second work function adjusting layer 52 disposed on first work function adjusting layer 51, on a portion of gate insulator layer 431 on third portion 313 and on a portion of first insulator layer 41. The gate structure may further include a gate 55 on second work function adjusting layer 52. The gate may include a metal such as tungsten, aluminum, or the like. The gate structure may also include a hardmask layer 433 having first and second portions that are on opposite sides of the gate, the first portion of the hardmask layer is disposed on the first portion and the second portion of the hardmask layer is disposed on the first insulator layer. Hardmask layer 433 may include silicon nitride.

In some embodiments, referring to FIG. 9, first work function adjusting layer 51 may also be formed on an inner wall of hardmask layer 433 disposed on first portion 311. In some embodiments, referring to FIG. 9, second work function adjusting layer 52 may also be formed on a portion of the first work function adjusting layer that is disposed on the inner wall of the hardmask layer.

In some embodiments, referring to FIG. 9, second work function adjusting layer 52 may also be formed on an inner wall of hardmask layer 433 on first insulator layer 41.

In some embodiments, the first conductivity type is N-type, and the second conductivity type is P-type. The first work function adjusting layer is a PMOS work function adjusting layer, the second work function adjusting layer is an NMOS work function adjusting layer. The first work function adjusting layer may include titanium nitrite (TiN) or tantalum nitride (TaN). The second work function adjusting layer may include titanium aluminum alloy (TiAl).

In other embodiments, the first conductivity type is P-type, and the second conductivity type is N-type. The first work function adjusting layer is an NMOS work function adjusting layer, and the second work function adjusting layer is a PMOS work function adjusting layer. The first work function adjusting layer may include titanium aluminum alloy (TiAl). The second work function adjusting layer may include titanium nitrite (TiN) or tantalum nitride (TaN).

In some embodiments, still referring to FIG. 9, the semiconductor device may further include an interlayer dielectric layer 48 surrounding the lateral periphery of the gate structure. The interlayer dielectric layer may include silicon dioxide.

In some embodiments, still referring to FIG. 9, the semiconductor device may further include a source 45 on first portion 311 and a drain 46 on second fin 32. The source and drain may include silicon germanium (SiGe). The first portion of the hardmask layer is disposed between source 45 and gate 55. The second portion of hardmask layer 433 is disposed between drain 46 and gate 55, and interlayer dielectric layer 48 covers source 45 and drain 46, as shown in FIG. 9.

The semiconductor device according to embodiments of the present invention has a gate oxide with enhanced anti-breakdown characteristics, thereby improving the device reliability.

In accordance with the present invention, the semiconductor device includes a first region 211 of a first conductivity type, a first portion 311 and second portion 312 that may serve as a diffusion region, a second region 212 of a second conductivity type, a third portion 313 and a second fin 32 that may serve as a drift region of the semiconductor device.

The anti-breakdown characteristics of the semiconductor device according to embodiments of the present invention will be described using the example of the first conductivity type being P-type and the second conductivity type being N-type.

In the case where the conductivity type is P-type, the second conductivity type is N-type, the first work function adjusting layer is an NMOS work function adjusting layer, and the second work function adjusting layer is a PMOS work function adjusting layer. When a power supply voltage VDD is applied to the gate, a channel may be formed in the diffusion region and the channel is in the electron inversion mode, the drift region is in the electron accumulation mode, e.g., electrons are accumulated in third portion 313 disposed under gate oxide 431. In general, the electron accumulation mode of the drift region is more likely to break down the gate oxide layer than the electron inversion mode. In the case where the drift region is an N-type well region, compared to the case where the second work function adjusting layer on third portion 313 is an NMOS work function adjusting layer, the second work function adjusting layer on third portion 313 is a PMOS work function adjusting layer, it is more difficult to make the drift region to enter the accumulation mode, so that the a relatively large portion of the power supply voltage applied to the drift region enters into the accumulation mode and the voltage applied to the gate insulator layer on the third portion is reduced, the electric field intensity of the gate insulator layer is reduced, thereby increasing the anti-breakdown performance of the gate insulator layer and improving the device reliability.

Conversely, in the case where the conductivity type is N-type, the second conductivity type is P-type, the diffusion region is namely an N-type well region and the drift region is a P-type well region, compared to the case where the second work function adjusting layer on third portion 313 is a PMOS work function adjusting layer, the second work function adjusting layer on third portion 313 is an NMOS work function adjusting layer it is more difficult to make the drift region to enter the accumulation mode, thereby increasing the anti-breakdown performance of the gate insulator layer and improving the device reliability.

Thus, embodiments of the present invention provide detailed description of a method of manufacturing a semiconductor device and a semiconductor device manufactured using the described method. In the description, numerous specific details such as formation of fins, source, drain, trenches, and the like have not been described in detail in order not to obscure the embodiments of the invention.

References in the specification to "one embodiment", "an embodiment an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device, the method comprising:
   providing a semiconductor structure, the semiconductor structure comprising:
   a semiconductor substrate including a first region of a first conductivity type and a second region of a second conductivity type, the first and second regions being laterally adjacent to each other, the first conductivity type being different from the second conductivity type;
   a first fin and a second fin protruding from the semiconductor substrate and separated from each other by a trench, the first fin including first and second portions of the first conductivity type and disposed on the first region and a third portion of the second conductivity type disposed on the second region, the first portion having an upper surface lower than an upper surface of the second portion, the second and third portions being laterally adjacent to each other; the second fin being of the second conductivity type and disposed on the second region; and
   a first insulator layer filling at least a portion of the trench;
   forming a first gate structure surrounding a portion of the second portion and a portion of the third portion, the first gate structure comprising:
   a first distal end on the first portion and a second distal end on the first insulator layer;
   a gate insulator layer on a surface portion of the first portion, the second portion, and the third portion; a first gate on the gate insulator layer; and
   a hardmask layer surrounding the first gate;
   forming an interlayer dielectric layer on the first gate structure;
   planarizing the interlayer dielectric layer and the hardmask layer to expose the first gate;
   removing the first gate to expose the gate insulator layer and a surface portion of the first insulator layer;
   forming a first work function adjusting layer on a portion of the gate insulator layer on the surface portion of the first portion and on the second portion; and forming a second work function adjusting layer on the first work function adjusting layer, the gate insulator layer on the third portion, and the exposed surface portion of the first insulator layer.

2. The method of claim 1, wherein the first conductivity type is N-type, the second conductivity type is P-type, the first work function adjusting layer is a PMOS work function adjusting layer, and the second work function adjusting layer is an NMOS work function adjusting layer.

3. The method of claim 2, wherein the first work function adjusting layer comprises titanium nitride or tantalum nitride, and the second work function adjusting layer comprises a titanium aluminum alloy.

4. The method of claim 1, wherein the first conductivity type is P-type, the second conductivity type is N-type, the first work function adjusting layer is an NMOS work function adjusting layer, and the second work function adjusting layer is a PMOS work function adjusting layer.

5. The method of claim 4, wherein the first work function adjusting layer comprises a titanium aluminum alloy, and the second work function adjusting layer comprises titanium nitride or tantalum nitride.

6. The method of claim 1, wherein the first gate structure covers a first portion of the first portion, the method further comprising, prior to forming the interlayer dielectric layer on the first gate structure:
forming a source on a second portion of the first portion that is not covered by the first gate structure and a drain on the second fin, wherein the source and the drain are covered by the subsequent formed interlayer dielectric layer.

7. The method of claim 1, further comprising:
forming a second gate on the second work function adjusting layer.

8. The method of claim 1, wherein forming the first work function adjusting layer comprises:
forming a patterned mask layer covering a first portion of the first work function adjusting layer on the gate insulator layer that is on the first and second portions while exposing a second portion of the first work function adjusting layer that is on the gate insulator layer on the third portion and the exposed surface portion of the insulator layer;
removing the second portion of the first work function adjusting layer; and
removing the patterned mask layer.

9. The method of claim 1, wherein the upper surface of the second portion is flush with an upper surface of the third portion.

10. The method of claim 1, wherein the first work function adjusting layer is further formed on an inner wall of the hardmask layer on the first portion.

11. A semiconductor device comprising:
a semiconductor substrate including a first region of a first conductivity type and a second region of a second conductivity type, the first and second regions being laterally adjacent to each other, the first conductivity type being different from the second conductivity type;
a first fin and a second fin protruding from the semiconductor substrate and separated from each other by a trench, the first fin including first and second portions of the first conductivity type and disposed on the first region and a third portion of the second conductivity type disposed on the second region, the first portion having an upper surface lower than an upper surface of the second portion, the second and third portions being laterally adjacent to each other; the second fin being of the second conductivity type and disposed on the second region;
a first insulator layer filling at least a portion of the trench;
a first gate structure surrounding a portion of the second portion and a portion of the third portion, the first gate structure comprising:
a first distal end on the first portion and a second distal end on the first insulator layer;
a gate insulator layer on a surface portion of the first portion, the second portion, and the third portion;
a first work function adjusting layer on a portion of the gate insulator layer that is on the surface portion of the first portion and the second portion;
a second work function adjusting layer on the first work function adjusting layer, a portion of the gate insulator layer on the third portion, and a surface portion of the first insulator layer;
a gate on the second work function adjusting layer;
a hardmask layer having first and second portions on opposite sides of the gate, the first portion of the hardmask layer disposed on the first portion and the second portion of the hardmask layer disposed on the first insulator layer; and
an interlayer dielectric layer surrounding the gate structure.

12. The semiconductor device of claim 11, wherein the first conductivity type is N-type, the second conductivity type is P-type, the first work function adjusting layer is a PMOS work function adjusting layer, and the second work function adjusting layer is an NMOS work function adjusting layer.

13. The semiconductor device of claim 12, wherein the first work function adjusting layer comprises titanium nitride or tantalum nitride, and the second work function adjusting layer comprises titanium aluminum alloy.

14. The semiconductor device of claim 11, wherein the first conductivity type is P-type, the second conductivity type is N-type, the first work function adjusting layer is an NMOS work function adjusting layer, and the second work function adjusting layer is a PMOS work function adjusting layer.

15. The semiconductor device of claim 14, wherein the first work function adjusting layer comprises titanium aluminum alloy, and the second work function adjusting layer comprises titanium nitride or tantalum nitride.

16. The semiconductor device of claim 11, further comprising:
a source on the first portion and a drain on the second fin, wherein the first portion of the hardmask layer is disposed between the source and the gate, and the interlayer dielectric layer covers the source and the drain.

17. The semiconductor device of claim 11, wherein the upper surface of the second portion is flush with an upper surface of the third portion.

18. The semiconductor device of claim 11, wherein the first work function adjusting layer is on the first portion of the hardmask layer, and the second work function adjusting layer is on the second portion of the hardmask layer.

* * * * *